United States Patent
Cai et al.

(10) Patent No.: US 9,287,130 B1
(45) Date of Patent: Mar. 15, 2016

(54) METHOD FOR SINGLE FIN CUTS USING SELECTIVE ION IMPLANTS

(71) Applicants: GLOBALFOUNDRIES Inc., Grand Cayman (KY); International Business Machines Corporation, Armonk, NY (US); STMicroelectronics, Inc., Coppell, TX (US)

(72) Inventors: Xiuyu Cai, Niskayuna, NY (US); Ajey Poovannummoottil Jacob, Watervliet, NY (US); Ruilong Xie, Niskayuna, NY (US); Bruce Doris, Slingerlands, NY (US); Kangguo Cheng, Schenectady, NY (US); Jason R. Cantone, Mechanicville, NY (US); Sylvie Mignot, Slingerlands, NY (US); David Moreau, Cohoes, NY (US); Muthumanickam Sankarapandian, Niskayuna, NY (US); Pierre Morin, Albany, NY (US); Su Chen Fan, Cohoes, NY (US); Kisik Choi, Hopewell Junction, NY (US); Murat K. Akarvardar, Saratoga Springs, NY (US)

(73) Assignees: GLOBALFOUNDRIES Inc., Grand Cayman (KY); International Business Machines Corporation, Armonk, NY (US); STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 14/676,345

(22) Filed: Apr. 1, 2015

Related U.S. Application Data (60) Provisional application No. 62/097,360, filed on Dec. 29, 2014.

(51) Int. Cl.
| | |
|---|---|
| *H01L 21/00* | (2006.01) |
| *H01L 21/308* | (2006.01) |
| *H01L 21/8234* | (2006.01) |
| *H01L 21/265* | (2006.01) |
| *H01L 21/266* | (2006.01) |

(52) U.S. Cl.
CPC .......... *H01L 21/3085* (2013.01); *H01L 21/266* (2013.01); *H01L 21/26586* (2013.01); *H01L 21/3086* (2013.01); *H01L 21/823431* (2013.01)

(58) Field of Classification Search
CPC ............... H01L 21/3085; H01L 21/823431; H01L 21/26586; H01L 21/266; H01L 21/3086
See application file for complete search history.

(56) References Cited

U.S. PATENT DOCUMENTS

| | | | | |
|---|---|---|---|---|
| 9,087,720 B1* | 7/2015 | Wu | ...................... | H01L 27/0886 |
| 9,112,032 B1* | 8/2015 | Liu | ................... | H01L 29/66795 |
| 2015/0294915 A1* | 10/2015 | Liu | ................. | H01L 21/823821 |
| | | | | 438/199 |

\* cited by examiner

*Primary Examiner* — Richard Booth
(74) *Attorney, Agent, or Firm* — Amerson Law Firm, PLLC (57) ABSTRACT

A method includes forming a plurality of fin elements above a substrate. A mask is formed above the substrate. The mask has an opening defined above at least one selected fin element of the plurality of fin elements. An ion species is implanted into the at least one selected fin element through the opening to increase its etch characteristics relative to the other fin elements. The at least one selected fin element is removed selectively relative to the other fin elements.

23 Claims, 9 Drawing Sheets

METHOD FOR SINGLE FIN CUTS USING SELECTIVE ION IMPLANTS

BACKGROUND OF THE INVENTION

1. Field of the Invention

The present disclosure generally relates to the fabrication of semiconductor devices, and, more particularly, to a method for making single fin cuts using selective ion implants.

2. Description of the Related Art

In modern integrated circuits, such as microprocessors, storage devices and the like, a very large number of circuit elements, especially transistors, are provided and operated on a restricted chip area. In integrated circuits fabricated using metal-oxide-semiconductor (MOS) technology, field effect transistors (FETs) (both NMOS and PMOS transistors) are provided that are typically operated in a switching mode. That is, these transistor devices exhibit a highly conductive state (on-state) and a high impedance state (off-state). FETs may take a variety of forms and configurations. For example, among other configurations, FETs may be either so-called planar FET devices or three-dimensional (3D) devices, such as finFET devices.

A field effect transistor (FET), irrespective of whether an NMOS transistor or a PMOS transistor is considered, and irrespective of whether it is a planar or 3D finFET device, typically comprises doped source/drain regions that are formed in a semiconductor substrate that are separated by a channel region. A gate insulation layer is positioned above the channel region and a conductive gate electrode is positioned above the gate insulation layer. The gate insulation layer and the gate electrode may sometimes be referred to as the gate structure for the device. By applying an appropriate voltage to the gate electrode, the channel region becomes conductive and current is allowed to flow from the source region to the drain region. In a planar FET device, the gate structure is formed above a substantially planar upper surface of the substrate. The gate structures for such planar FET devices may be manufactured using so-called "gate-first" or "replacement gate" (gate-last) manufacturing techniques.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation distance between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

Figure 1A:
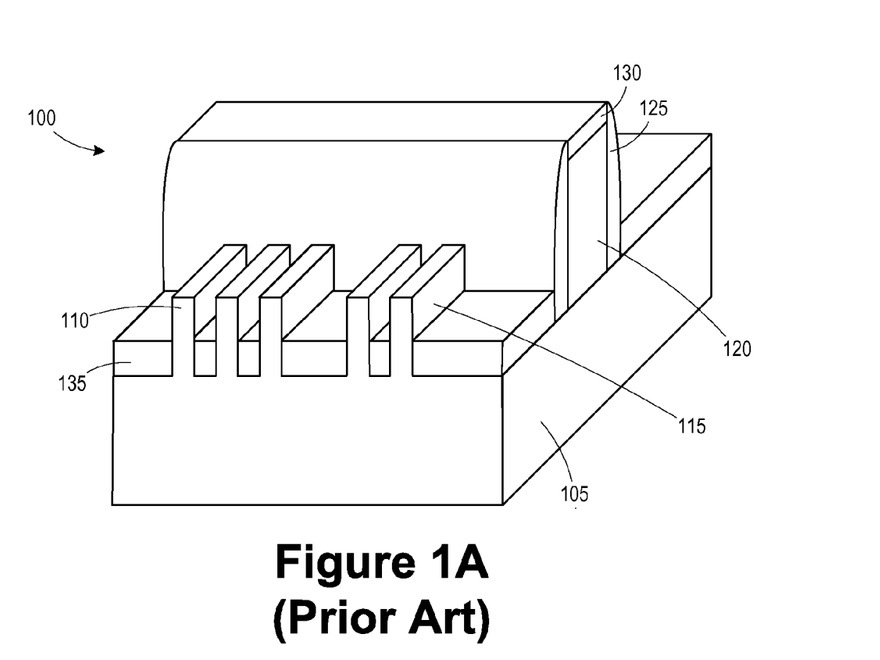
FIGS. 1A-1E schematically depict an illustrative prior art finFET device and methods for selectively removing fins during the manufacture of the finFET device.

In contrast to a FET, which has a planar structure, a so-called finFET device has a three-dimensional (3D) structure. FIG. 1A is a perspective view of an illustrative prior art finFET semiconductor device 100 that is formed above a semiconductor substrate 105. In this example, the finFET device 100 includes five illustrative fins 110, 115, a gate structure 120, sidewall spacers 125 and a gate cap 130. The finFET device 100 implements two different transistor devices with a shared gate structure. The gate structure 120 is typically comprised of a layer of insulating material (not separately shown), e.g., a layer of high-k insulating material or silicon dioxide, and one or more conductive material layers (e.g., metal and/or polysilicon) that serve as the gate electrode for the device 100. The fins 110, 115 have a three-dimensional configuration. The portions of the fins 110, 115 covered by the gate structure 120 define the channel regions of the finFET device 100. An isolation structure 135 is formed between the fins 110, 115. The fins 110 are associated with a transistor device of a first type (e.g., N-type), and the fins 115 are associated with a transistor device of a complementary type (e.g., P-type). The gate structure 120 is shared by the N-type and P-type transistors, a common configuration for memory devices, such as static random access memory (SRAM) cells.

Typically, fins are formed in a regular array. To provide separation between the first group of fins 110 and the second group of fins 115 to facilitate separate processing and to electrically isolate the two different devices, one or more of the fins in the array are removed prior to forming the gate structure. Selected fins may be removed after they are formed (fins-cut-last), or the hard mask used to etch the fins may be modified to remove a fin mask element prior to etching the fins (fins-cut-first).

Figure 1B:
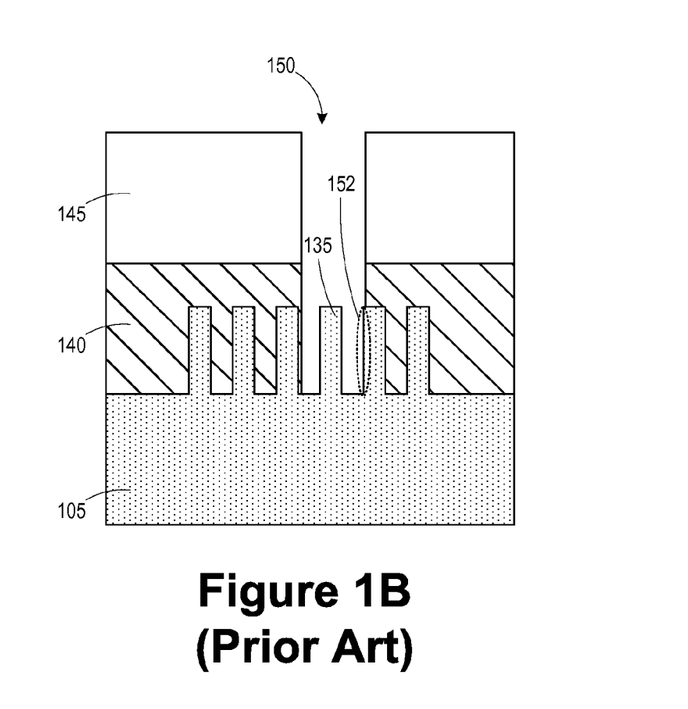

As illustrated in FIG. 1B, one technique for removing a selected fin feature 135 (actual fin or hard mask fin element) is to form a dielectric layer 140 above the fins, pattern a photoresist layer 145 to define an opening 150 above the selected fin 135, and perform an etch process to remove the dielectric material 140 to expose the fin 135. The fin 135 may be removed by a subsequent etch process. When exposing the fin 135, the etch process may also expose or damage adjacent fins due to alignment errors or to imperfect anisotropic etch processes (i.e., where an isotropic component is present), as indicated by the circled exposed edge 152. These unintentionally exposed fins may be further damaged during the etch process to remove the fin 135. This damage can lead to reduced performance or defects.

Figure 1C:
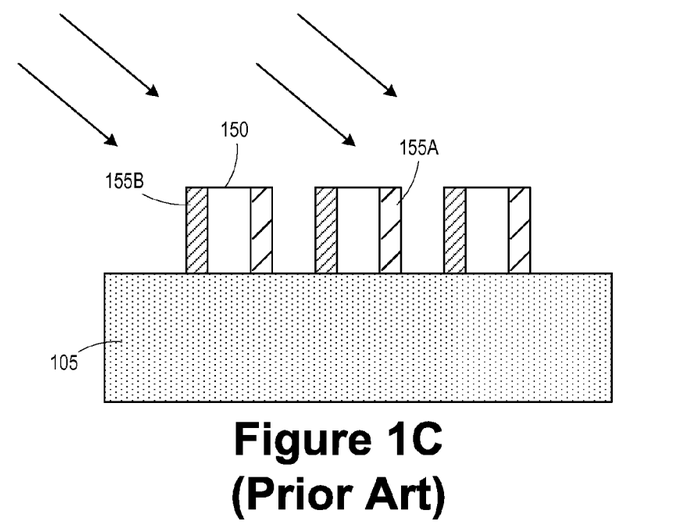
Figure 1D:
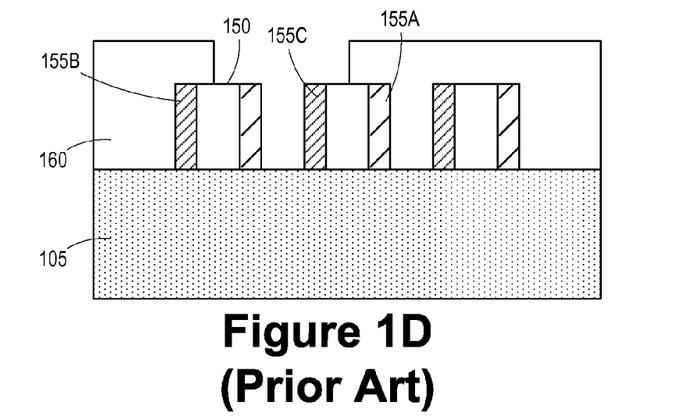
Figure 1E:
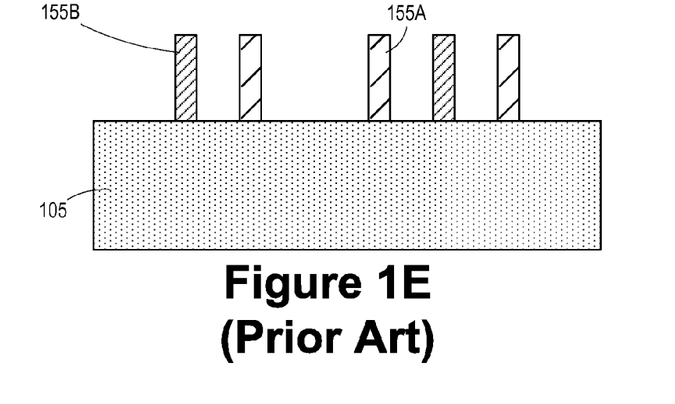

FIGS. 1C-1E illustrate another technique for removing a selected fin. As illustrated in FIG. 1C, a fin mask layer includes a plurality of mandrel elements 150 with sidewall spacers 155A, 155B formed thereon. Additional hard mask layers (e.g., silicon nitride and silicon dioxide) may be formed beneath the mandrel elements 150 and spacers 155A, 155B, but these layers are omitted for ease of illustration. The mandrel elements 150 are removed prior to etching the fins, thus leaving the spacers 155A, 155B in place as the etch mask that is positioned above the underlying layer(s) to be patterned (e.g., the hard mask layers, followed by the substrate material), a technique referred to as sidewall spacer image transfer. A blanket angled ion implantation process is performed to change the etch characteristics of the spacers 155B on the sides of the mandrel elements exposed to the implantation.

In FIG. 1D, a photoresist layer 160 is formed above the mandrel elements 150 and the spacers 155A, 155B and patterned to expose a selected spacer 155C. An etch process is performed to remove the selected spacer 155C. Due to the relative differences in etch characteristics between the spacers 155A and the selected spacer 155C (as a result of the aforementioned ion implantation process), the selected spacer 155C can be selectively removed even though some of the spacers 155A are also exposed to the etching process.

As illustrated in FIG. 1E, after the photoresist layer 160 and mandrel elements are removed, the remaining spacers 155B, 155A are used as a patterned etch mask to etch the fins and/or one or more layers of insulating material positioned between the etch mask and the substrate 105. However, because the etch mask includes both spacers 155B, 155A, with differing etch characteristics, the subsequent etch process(es) to form the fins are less predictable and may exhibit reliability issues.

The present disclosure is directed to various methods and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming semiconductor devices. A method includes, among other things, forming a plurality of fin elements above a substrate. A mask is formed above the substrate. The mask has an opening defined above at least one selected fin element of the plurality of fin elements. An ion species is implanted into the at least one selected fin element through the opening to increase its etch characteristics relative to the other fin elements. The at least one selected fin element is removed selectively relative to the other fin elements.

Another method includes, among other things, forming a hard mask layer above a substrate. A plurality of fin elements are formed above the hard mask layer. A mask layer is formed above the fin elements. The mask has an opening defined above at least one selected fin element of the plurality of fin elements. An ion species is implanted into the at least one selected fin element through the opening to increase its etch characteristics relative to the other fin elements. The at least one selected fin element is removed selectively relative to the other fin elements. A pattern defined by the remaining fin elements is transferred to the hard mask layer to define a patterned hard mask layer. The substrate is etched using the patterned hard mask layer as an etch mask to define a plurality of fins in the substrate.

Yet another method includes, among other things, forming a plurality of fins in a substrate. The fins include semiconductor material. A mask is formed above the fins. The mask has an opening defined above at least one selected fin of the plurality of fins. An ion species is implanted into the at least one selected fin through the opening to increase its etch characteristics relative to the other fins. The at least one selected fin is removed selectively relative to the other fins.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of selectively removing fins for a finFET device. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

Figure 2A:
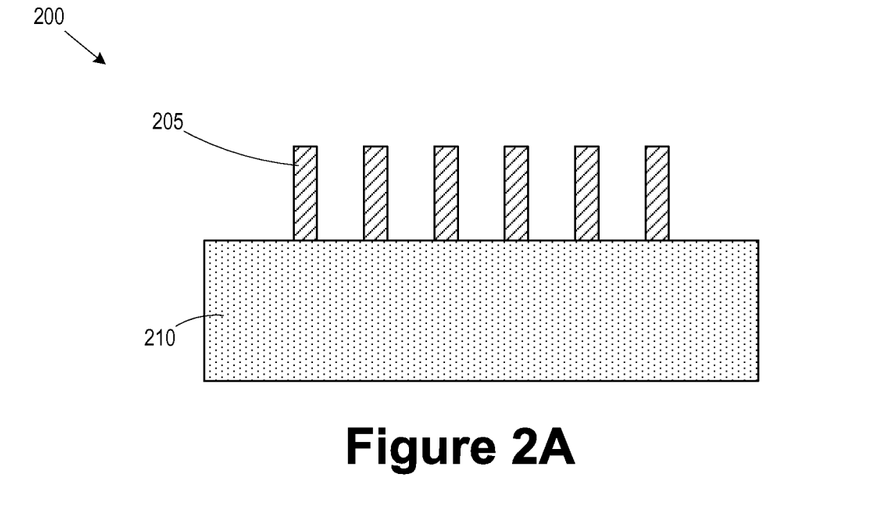
FIGS. 2A-2E depict various methods disclosed herein of selectively removing fin elements during the fabrication of a finFET device using an implantation process to change etch characteristics of a selected fin element.

FIGS. 2A-2E illustrate various methods for forming a finFET device 200. As shown in FIG. 2A, a plurality of the fin elements 205 are defined above a substrate 210. The methods described herein may be applied to a fins-cut-first technique or a fins-cut-last technique. For a fins-cut-first technique, the fin elements 205 may be mask elements for cutting fins into the substrate 210. Additional hard mask layers (not shown) (e.g., silicon nitride and silicon dioxide) may be formed beneath the fin elements 205, but these layers are omitted for ease of illustration. The pattern from the fin elements 205 may be transferred to the hard mask layer(s) (not shown), and subsequently transferred to the substrate 210. For a fins-cut-last technique, the fin elements 205 have already been cut into the substrate 210, and the fin elements 205 and the substrate 210 may be formed of the same material. Different cross-hatching is used for the fin elements 205 and the substrate 210 simply to facilitate description of the presently disclosed subject matter.

The substrate 210 may have a variety of configurations, such as the depicted bulk silicon configuration. The substrate 210 may also have a silicon-on-insulator (SOI) configuration that includes a bulk silicon layer, a buried insulation layer and an active layer, wherein semiconductor devices are formed in and above the active layer. The substrate 210 may be formed of silicon or silicon germanium or it may be made of materials other than silicon, such as germanium. Thus, the terms "substrate" or "semiconductor substrate" should be understood to cover all semiconducting materials and all forms of such materials. The substrate 210 may have different layers.

Figure 2B:
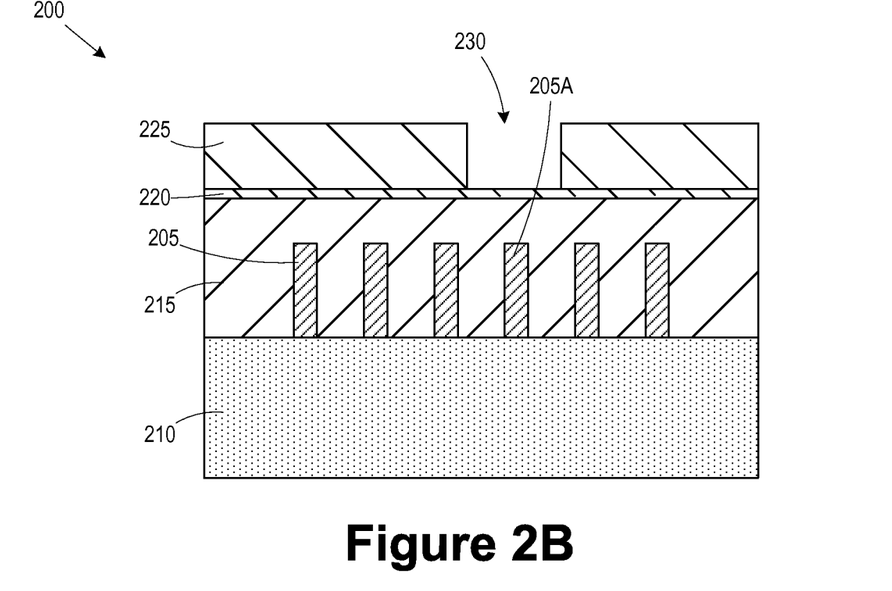

FIG. 2B illustrates the device 200 after a plurality of processes have been performed to form a dielectric layer 215 (e.g., silicon dioxide or a low-k dielectric material) above the substrate 210 and the fin elements 205, to form a cap layer 220 (e.g., silicon nitride) above the dielectric layer 215, to form a photoresist layer 225 above the cap layer 220, and to pattern the photoresist layer 225 to define an opening 230 above a selected fin element 205A that is to be removed.

Figure 2C:
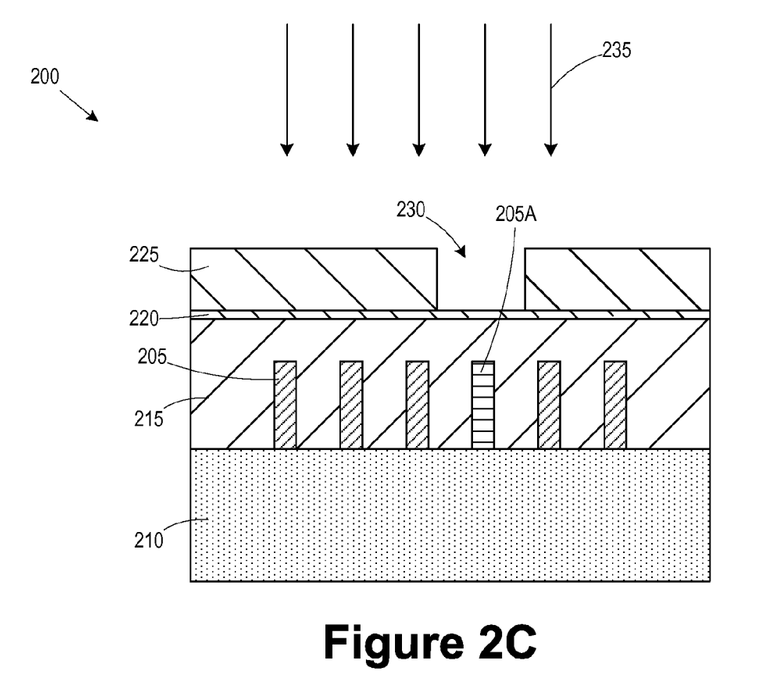

FIG. 2C illustrates the device 200 after performing an implantation process 235 through the opening 230 to selectively implant the fin element 205A (e.g., with argon) to change its etch characteristics relative to the other fin elements 205. In some embodiments, the cap layer 220 may be etched through the opening 230 and removed prior to performing the implantation process 235. The implant process 235 increases the etch rate of the fin element 205A relative to the other fin elements 205.

Figure 2D:
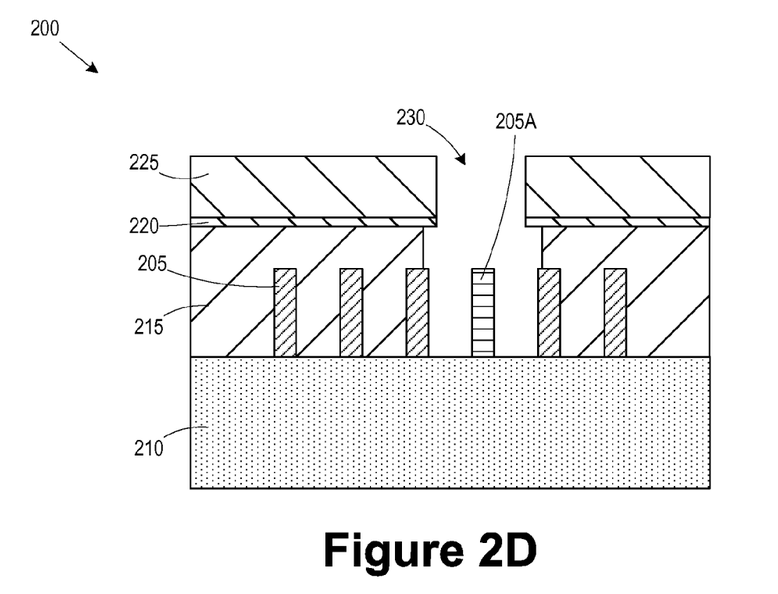
Figure 2E:
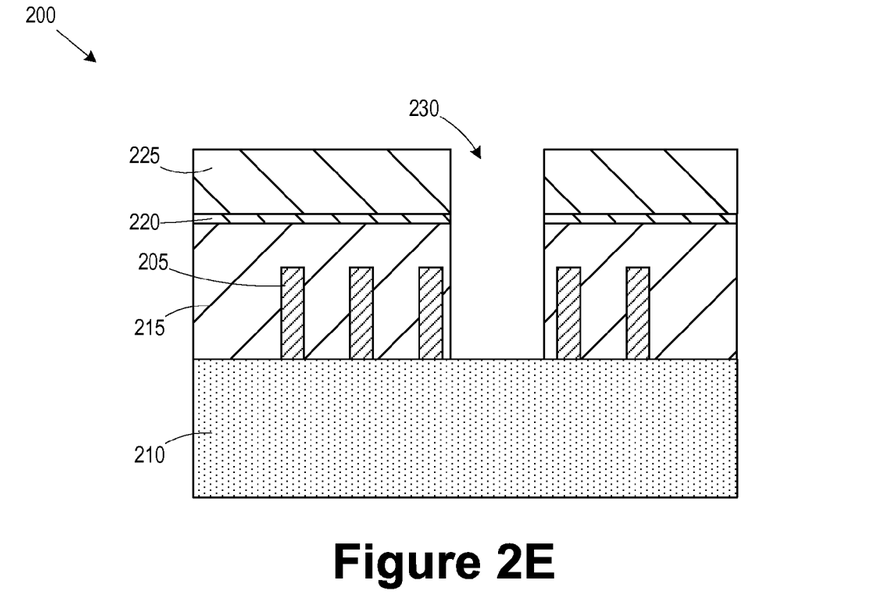

FIG. 2D illustrates the device 200 after performing one or more anisotropic etch processes to remove the portions of the cap layer 220 and the dielectric layer 215 exposed by the opening 230. FIG. 2E illustrates the device after performing an etch process to remove the selected fin 205A. In an embodiment where the selected fin 205A is a spacer (fins-cut-first), an HF wet etch may be used (20:1 selectivity), and in an embodiment where the selected fin 205A is a silicon-containing fin, Ge or Ar and $H_2$ may be used as an implant species to amorphize and hydrogenate the selected fin 205 and a hydrogen plasma etch ambient may be used to remove it. For a hydrogen etch plasma, the selectivity between amorphized silicon and crystalline silicon is approximately 10:1. Even if one of the adjacent fins 205 is exposed during the etching of the dielectric layer 215, it would have different etch characteristics than the fin element 205A, as it was not subjected to the implantation process 235, which was constrained by the photoresist layer 225. As a result, the process constraints on the etch process for the dielectric layer 215 may be reduced. In some embodiments, the etch process to remove the dielectric layer 215 may also concurrently remove the selected fin element 205A if the etch is sufficiently selective so as to not etch any exposed adjacent fin elements 205 (e.g., such as the hydrogen plasma etch described above). In such an embodiment, the process flow would advance from FIG. 2C to FIG. 2E, without intervening FIG. 2D.

Figure 3A:
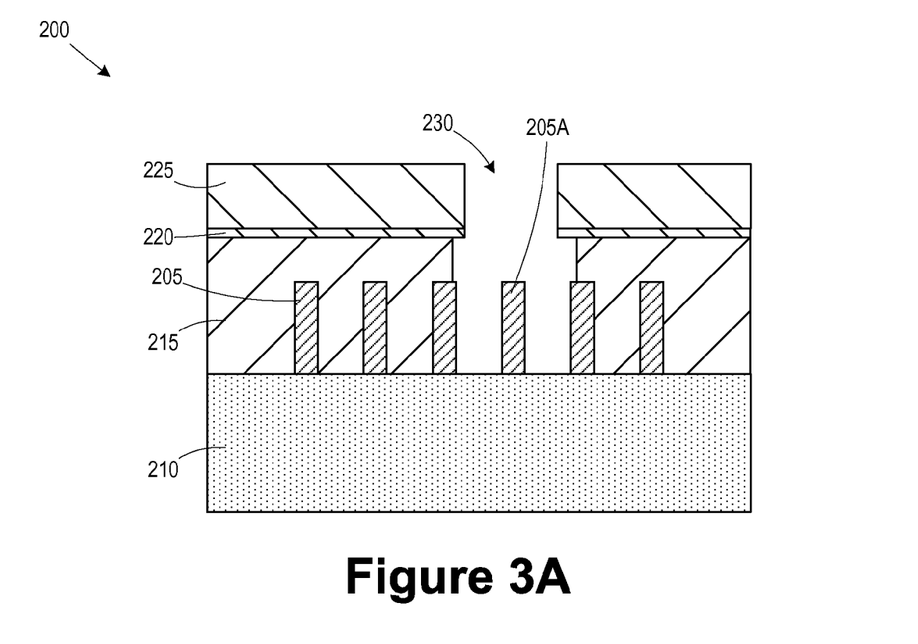
FIGS. 3A-3B depict an alternative process flow for selectively removing fin elements during the fabrication of a finFET device by exposing the selected fin prior to the implantation process.
Figure 3B:
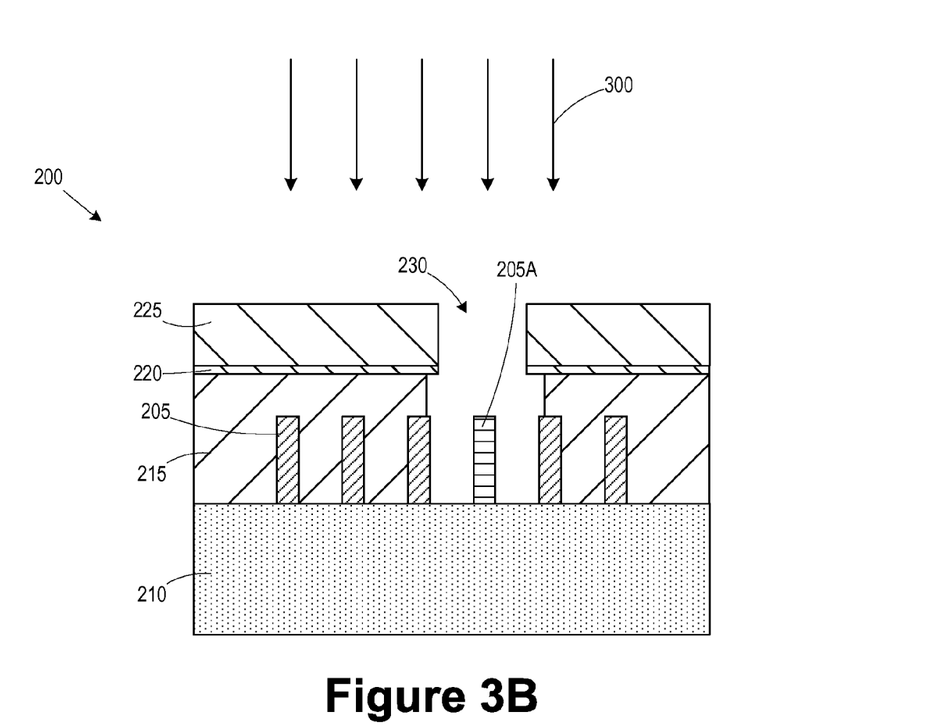

FIG. 3A-3B illustrate an alternative process flow where the etching of the dielectric layer 215 occurs prior to performing the above-described implantation process 235, thereby exposing the selected fin 205A. FIG. 3A illustrates the device after the etch process to remove the dielectric layer 215 to expose the selected fin 205A that is to be removed. FIG. 3B illustrates the device after performing an implantation process 300 (e.g., such as described above) on the selected fin 205A to alter its etch characteristics. Because the photoresist layer 225 constrains the implantation process 300, the adjacent fins 205 will not be implanted even if they are exposed by the etch process for removing the dielectric layer 215. The fin element 205A may be subsequently removed as previously illustrated in FIG. 2E.

Figure 4A:
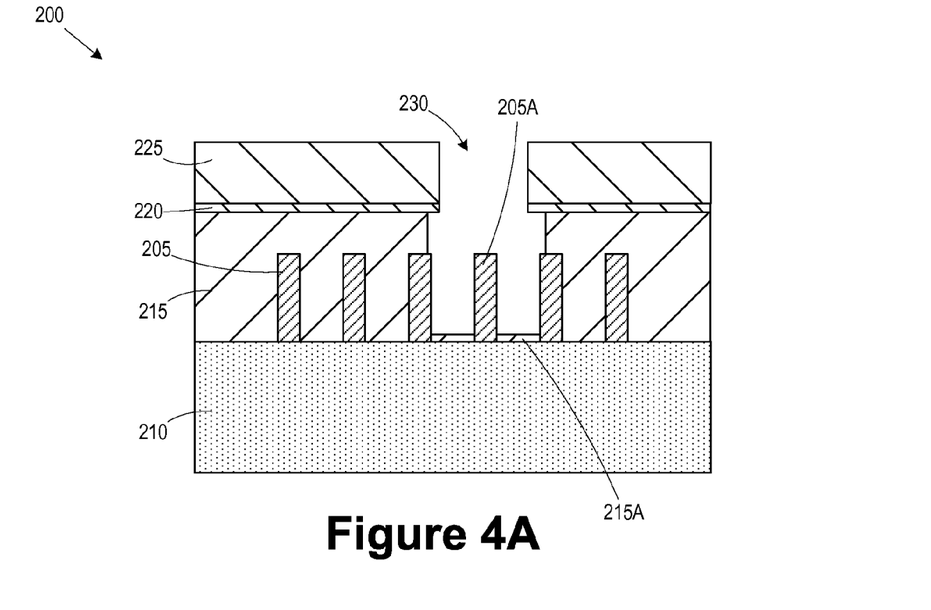
FIGS. 4A-4B depict yet another alternative process flow for selectively removing fin elements during the fabrication of a finFET device by protecting an underlying substrate during the implantation process.
Figure 4B:
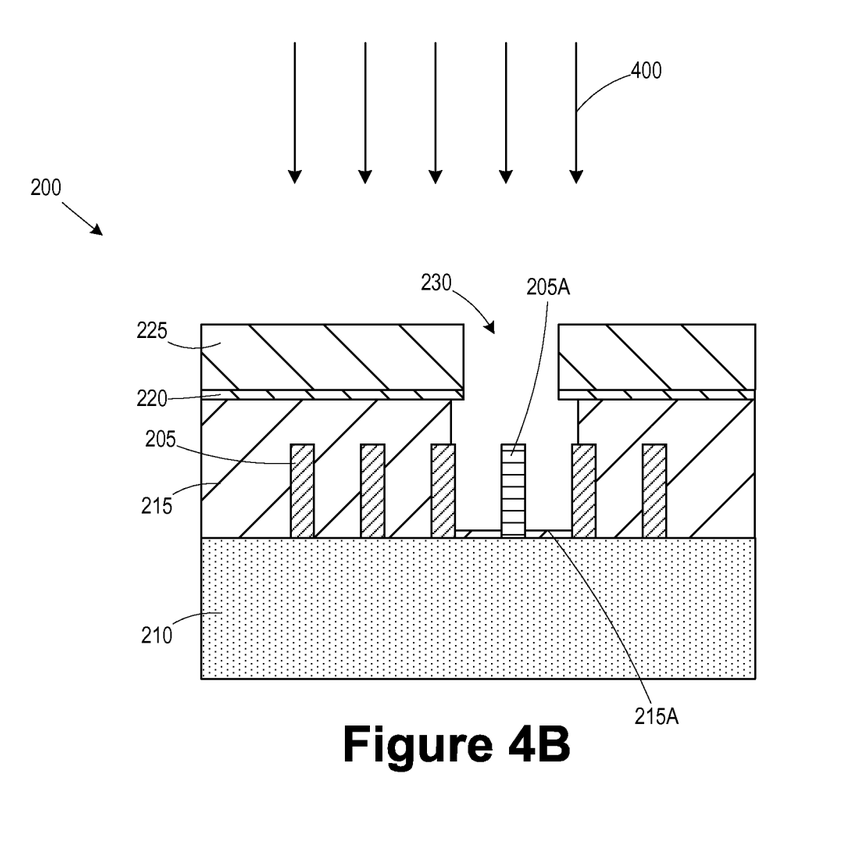

FIGS. 4A-4B illustrate an alternative process flow where the dielectric layer 215 is not completely removed. FIG. 4A illustrates the device after the etch process to partially remove the dielectric layer 215 to expose the selected fin 205A. A portion 215A of the dielectric layer 215 remains above the substrate 210 adjacent the selected fin element 205A to protect the substrate. FIG. 4B illustrates the device after performing an implantation process 400 on the selected fin 205A to alter its etch characteristics (e.g., such as described above). Because the photoresist layer 225 constrains the implantation process 400, the adjacent fins 205 will not be implanted even if they are exposed by the etch process for removing the dielectric layer 215. Also, because the substrate 210 is not exposed, the implantation process 400 can selectively alter the etch characteristics of the fin element 205A without altering those of the substrate 210. This situation is useful in a fins-cut-last approach, where the fin elements 205, 205A and the substrate 210 are formed of the same material. The fin element 205A may be subsequently removed as previously illustrated in FIG. 2E.

Figure 5A:
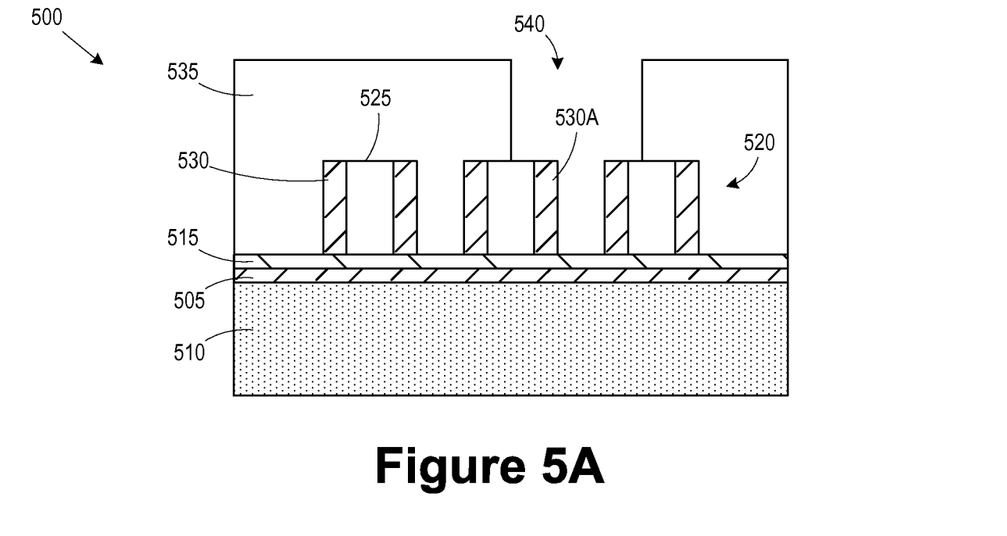
FIGS. 5A-5E depict still another alternative process flow for selectively removing fin elements during the fabrication of a finFET device using an angled implantation process.

FIGS. 5A-5E illustrate an alternative process flow for fabricating a finFET device 500 by performing a fins-cut-first technique to alter an etch mask for subsequently forming fins. As illustrated in FIG. 5A, a first hard mask layer 505 (e.g., silicon nitride) may be formed above the substrate 510, and a second hard mask layer 515 (e.g., silicon dioxide) may be formed above the first hard mask layer 505. A mask layer 520 including a plurality of mandrel elements 525 (e.g., photoresist) with sidewall spacers 530 (e.g., silicon nitride) formed thereon is formed above the second hard mask layer 515. A photoresist layer 535 is formed above the mask layer 520 and patterned to expose a selected spacer 530A through an opening 540.

Figure 5B:
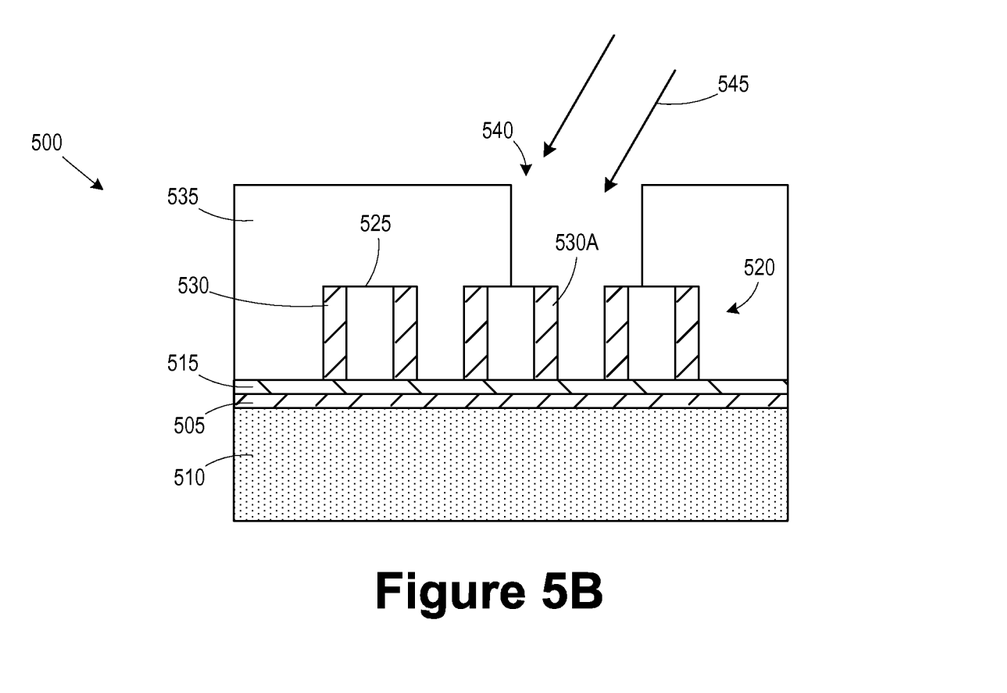

FIG. 5B illustrates the device 500 after performing an angled implantation process 545 through the opening to change the etch characteristics of the selected spacer 530A. The photoresist layer 535 shields any adjacent spacers 530 exposed in the opening 540 from the angled implantation process 545. The ion implantation increases the etch rate of the selected spacer 530A relative to the other spacers 530.

Figure 5C:
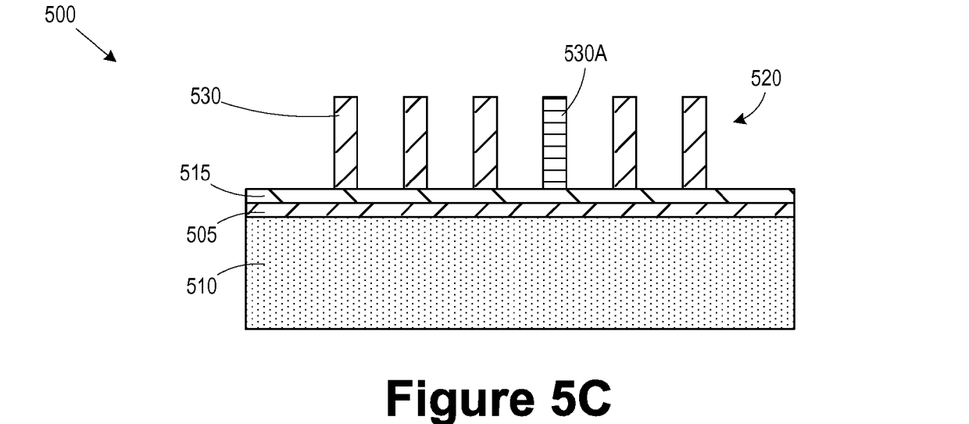
Figure 5D:
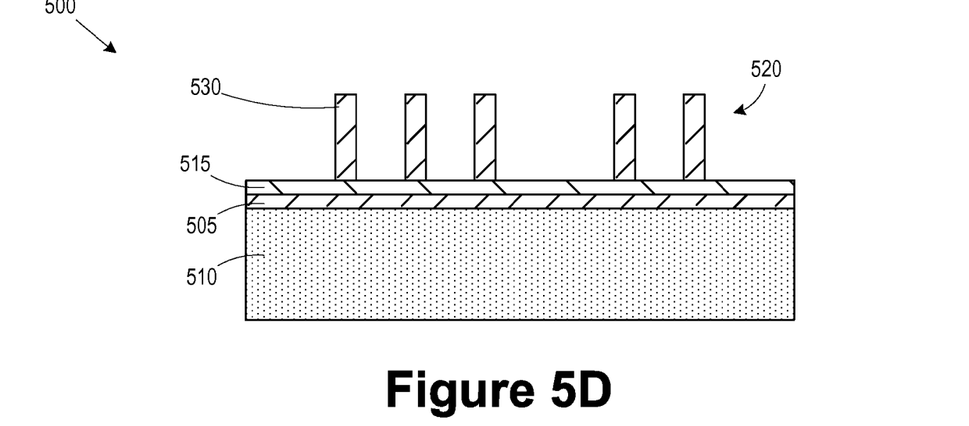
Figure 5E:
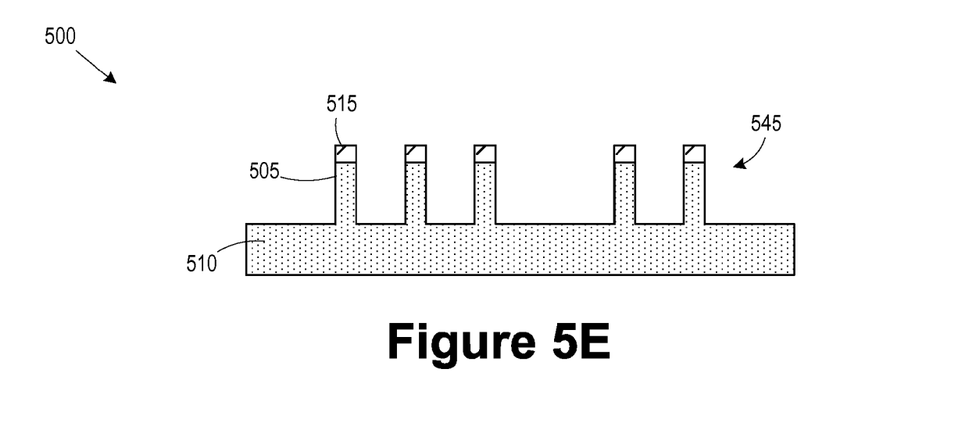

FIG. 5C illustrates the device 500 after performing an ashing process to remove the photoresist layer 535 and the mandrel elements 525. FIG. 5D illustrates the device 500 after performing a selective etch process to remove the selected spacer 530A. The spacers 530 may be partially consumed by the selective etch process due to imperfect selectivity, but, in general, substantial portions of the spacers 530 survive the selective etch process, although they may be decreased in width or height. FIG. 5E illustrates the device 500 after performing several etch processes to transfer the pattern from the spacers 530 to the hard mask layers 505, 515 and to etch the substrate 510 to define fins 545 therein. Any remnants of the spacers 530 may be removed between the various etching processes for transferring the pattern to the hard mask layer 515 or the hard mask layer 505.

Additional processing steps may be performed after the fin cut processes to complete fabrication of the finFET devices 200, 500. For example, a gate structure may be formed, an isolation structure may be formed between fins, doping processes may be performed to define source/drain regions for the transistor devices, contacts may be formed, and metallization layers including lines and vias may be formed.

In general, the fin cut techniques described herein rely on targeted implantation processes to alter the etch characteristic of selected fin elements to be removed. Such targeted implantation processes can be controlled with a higher degree of precision, as compared to etch processes, so as to avoid damaging adjacent fin elements.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming a plurality of fin elements above a substrate;
    forming a mask above said substrate, said mask having an opening defined above at least one selected fin element of said plurality of fin elements;
    implanting an ion species into said at least one selected fin element through said opening to increase its etch characteristics relative to the other fin elements; and
    removing said at least one selected fin element selectively relative to said other fin elements.

2. The method of claim 1, wherein said fin elements comprise etch mask elements, and the method comprises etching a substrate after removing said selected fin element to define a plurality of fins in said substrate.

3. The method of claim 1, wherein said fin elements comprise fins defined in said substrate.

4. The method of claim 1, further comprising:
    forming a dielectric layer above said plurality of fin elements;
    forming said mask above said dielectric layer; and
    implanting said ion species through said dielectric layer into said selected fin element.

5. The method of claim 4, further comprising forming a cap layer between said dielectric layer and said mask.

6. The method of claim 4, further comprising removing a first portion of said dielectric layer exposed by said opening prior to implanting said ion species.

7. The method of claim 6, wherein a second portion of said dielectric layer disposed above said substrate remains adjacent said selected fin after removing said first portion.

8. The method of claim 4, further comprising removing a first portion of said dielectric layer exposed by said opening and said selected fin element in a concurrent etch process.

9. The method of claim 1, wherein said fin elements comprise spacers formed on sidewalls of mandrel elements, said opening exposes said selected fin element, and implanting said ion species comprises performing an angled implant process.

10. The method of claim 9, further comprising:
    forming at least one hard mask layer between said substrate and said fin elements;
    removing said mask and said mandrel elements after removing said selected fin element;
    transferring a pattern defined by the remaining fin elements to said at least one hard mask layer to define a patterned hard mask layer; and
    etching said substrate using said patterned hard mask layer as an etch mask to define a plurality of fins in said substrate.

11. A method comprising:
    forming a hard mask layer above a substrate;
    forming a plurality of fin elements above said hard mask layer;
    forming a mask layer above said fin elements, said mask layer having an opening defined above at least one selected fin element of said plurality of fin elements;
    implanting an ion species into said at least one selected fin element through said opening to increase its etch characteristics relative to the other fin elements;
    removing said at least one selected fin element selectively relative to said other fin elements;
    transferring a pattern defined by the remaining fin elements to said hard mask layer to define a patterned hard mask layer; and
    etching said substrate using said patterned hard mask layer as an etch mask to define a plurality of fins in said substrate.

12. The method of claim 11, further comprising:
    forming a dielectric layer above said plurality of fin elements;
    forming said mask above said dielectric layer; and
    implanting said ion species through said dielectric layer into said selected fin element.

13. The method of claim 12, further comprising forming a cap layer between said dielectric layer and said mask.

14. The method of claim 12, further comprising removing a first portion of said dielectric layer exposed by said opening prior to implanting said ion species.

15. The method of claim 14, wherein a second portion of said dielectric layer disposed above said substrate remains adjacent said selected fin after removing said first portion.

16. The method of claim 12, further comprising removing a first portion of said dielectric layer exposed by said opening and said selected fin element in a concurrent etch process.

17. The method of claim 11, wherein said fin elements comprise spacers formed on sidewalls of mandrel elements, said opening exposes said selected fin element, and implanting said ion species comprises performing an angled implant process.

18. A method, comprising:
    forming a plurality of fins in a substrate, said fins comprising semiconductor material;
    forming a mask above said fins, said mask having an opening defined above at least one selected fin of said plurality of fins;
    implanting an ion species into said at least one selected fin through said opening to increase its etch characteristics relative to the other fins; and
    removing said at least one selected fin selectively relative to said other fins.

19. The method of claim 18, further comprising:
forming a dielectric layer above said plurality of fins;
forming said mask above said dielectric layer; and
implanting said ion species through said dielectric layer into said selected fin.

20. The method of claim 19, further comprising forming a cap layer between said dielectric layer and said mask.

21. The method of claim 19, further comprising removing a first portion of said dielectric layer exposed by said opening prior to implanting said ion species.

22. The method of claim 21, wherein a second portion of said dielectric layer disposed above said substrate remains adjacent said selected fin after removing said first portion.

23. The method of claim 19, further comprising removing a first portion of said dielectric layer exposed by said opening and said selected fin element in a concurrent etch process.

* * * * *